United States Patent [19]

Moloney et al.

[11] Patent Number: 5,521,598
[45] Date of Patent: May 28, 1996

[54] RLL/NRZ DECODER PROGRAMMABLE FOR SINGLE/DUAL BIT OUTPUT DATA STREAMS

[75] Inventors: David Moloney, Cornaredo; Paolo Gadducci, Tirrenia; Marco Demicheli, Binago; Roberto Alini, Stradella, all of Italy

[73] Assignee: SGS-Thomson Microelectronics, SRL, Agrate Brianza, Italy

[21] Appl. No.: 285,842

[22] Filed: Aug. 4, 1994

[30] Foreign Application Priority Data

Oct. 11, 1993 [EP] European Pat. Off. ............... 93830452

[51] Int. Cl.[6] .................................................. H03M 7/00
[52] U.S. Cl. ................................................ 341/59; 341/68
[58] Field of Search .................................. 341/59, 68, 69, 341/55, 61

[56] References Cited

U.S. PATENT DOCUMENTS

| | | | |
|---|---|---|---|
| 3,852,687 | 12/1974 | Hodges | 332/11 R |
| 3,996,613 | 12/1976 | Manning et al. | 360/40 |
| 4,323,931 | 4/1982 | Jacoby | 360/40 |
| 4,337,458 | 6/1982 | Cohn et al. | 341/55 |
| 4,451,819 | 5/1984 | Beckenhauer | 341/61 |
| 4,538,189 | 8/1985 | Fitzpatrick | 360/40 |
| 4,617,552 | 10/1986 | Kojima et al. | 341/68 |
| 4,833,470 | 5/1989 | Iketani | 341/59 |
| 4,908,721 | 3/1990 | Rub | 360/40 |
| 5,062,011 | 10/1991 | Hase et al. | 360/40 |
| 5,172,359 | 12/1992 | Sato | 369/59 |
| 5,177,482 | 1/1993 | Cideciyan et al. | 341/59 |
| 5,327,124 | 7/1994 | Funamoto | 31/58 |

FOREIGN PATENT DOCUMENTS 0271317  6/1988  European Pat. Off. ........ G11B 20/14

*Primary Examiner*—Marc S. Hoff
*Attorney, Agent, or Firm*—Felsman, Bradley, Gunter & Dillon

[57] ABSTRACT

A decoder of a coded serial stream of digital data in a stream of decoded NRZ data has re-timing (BB, AA) flip-flops and a 2×1 multiplexer (MUX OUT) selectably providing a single-bit NRZ output stream or a dual-bit (NRZ0 and NRZ1) output streams, by exploiting the predecoded values (ND0 and ND1) produced by two decoding combinative logic networks (RC1 and RC2) that compose the decoder.

6 Claims, 4 Drawing Sheets

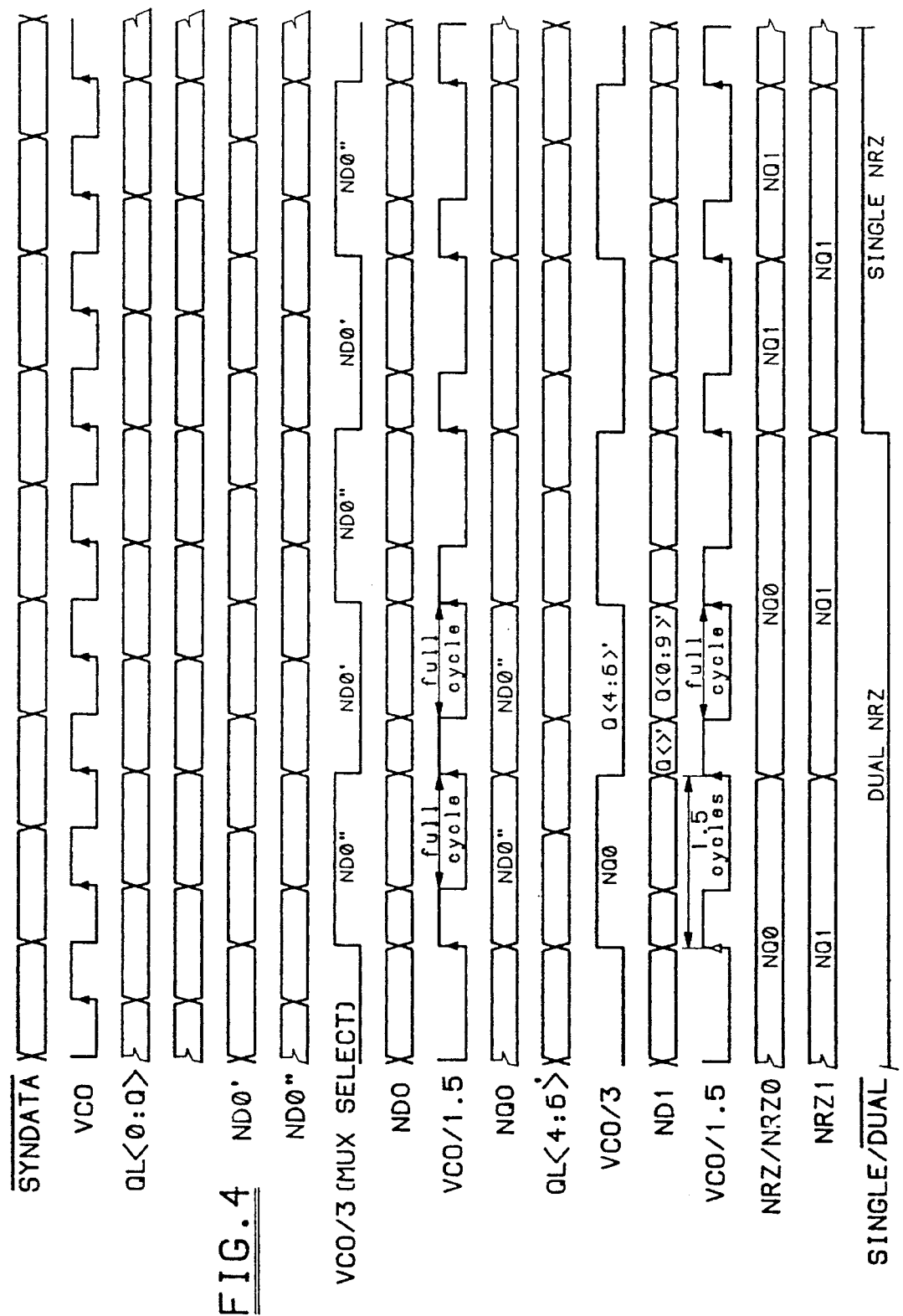

RLL/NRZ DECODER PROGRAMMABLE FOR SINGLE/DUAL BIT OUTPUT DATA STREAMS

CROSS REFERENCE TO RELATED APPLICATION

This application contains subject matter in common with copending application Ser. No. 08/285,918, Attorney Docket No. 93-CA-011, filed on even date herewith, titled PIPELINED DECODER FOR HIGH FREQUENCY OPERATION, by Moloney, et al., and assigned to the assignee hereof. Such co-pending application is hereby expressly incorporated by reference into the present application.

FIELD OF THE INVENTION

The invention generally relates to a programmable decoder for serial data transfer channels, for example from peripherals to a Central Processing Unit (CPU) and vice-versa. The invention is particularly useful for read/write channels of mass memories, for example hard disk systems.

BACKGROUND OF THE INVENTION

In mass data storage supports, as for example hard disks, floppy disks, CDs, tape streamers and the like, digital data are stored, in practice, by physically recording on the support only the logic "1", and by "spacing" them by "segments" of a recording track, the length of which is proportional to the number of logical "0" present between successive "1".

Considerations on the dynamic character typical of rotating supports or generally of translating supports, impose a minimum value of the separation distance between adjacently recorded "1". In fact, if two successive "1" are physically recorded one next to the other on the support, inevitable interferences between the two recorded peaks detected in reading the data which is on the support, can cause uncertainties and errors due to practical limitations of the discriminating capabilities of the reading pick-ups.

Another common peculiarity of these mass data storage systems is represented by the fact that the sampling clock signal, used in the write/read channels, cannot be derived from a fixed system's clock. Necessarily it must be a clock signal that is derived or extracted directly from the incoming serial stream of data, the speed of which may often vary. For example, in the case of a hard disk, data recorded on outer tracks may be written and read at a higher linear speed than data written and read on inner concentric tracks. Generally, in this as in other applications, a variable frequency clock signal, synchronous with the serial stream of data (pulses), is generated by detecting transitions in the coded stream of pulses that represents the succession of digital data, for example by employing a common phase-locked, ring circuit (PLL), cooperating with a voltage controlled oscillator (VCO). Where the need exists for self-generating a synchronous, variable frequency, clock signal, there may be a limit to the maximum tolerable "distance" between any two successively recorded logic "1". In fact, if successive transitions occur after an excessively long interval of time, synchronism of the frequency of the self-generated clock signal, "phase-locked" with the pulse stream, can be partially lost. Thus this situation would introduce, also in this case, conditions of indiscrimination of the correct sampling instant and therefore the possibility of errors during reading.

These "dynamic" limits in the operation of these systems are commonly overcome by employing special coding systems for the data being transferred, which ensure a certain minimum number of "0" and a certain maximum number of "0" between any two successive "1" of a coded binary data stream.

There are different coding protocols of this type. For example in the RLL(2,7) coding (an acronym for Run Length Limited), the values 2 and 7 indicate the minimum (2) number and the maximum (7) number, respectively, of "0" between two successive "1". In the RLL(1,7) system, the two values indicate the minimum number (1) and the maximum number (7) of "0", that can be present between any two successive "1" of a coded binary data.

Of course, the use of a particular coding of the serial data stream, for example from and to a rotating mass storage support, or also from and to a different type of peripheral having dynamic characteristics of operation similar thereto, implies the use of special coding and decoding circuits of the serial stream of digital data.

A peculiarity common to these as well as to other coding/decoding systems is represented by the fact that the "frequencies" of the input and output serial data streams are different from each other. To a certain X number of bits of a decoded data serial signal, commonly of the so-called NRZ type (an acronym of Non-Return-to-Zero), correspond a greater Y number of bits ($Y=X+z$, where $z \geq 1$) of a coded data serial signal. For example, to three bits (pulses) of the coded signal may correspond two bits (pulses) of an NRZ stream of decoded data. This fact implies that, during a reading phase, a certain time base frequency (base clock) VCO, is extracted from the sequence of transitions of the input coded signal, for example by the use of a PLL circuit, and from said base clock other fractionary frequency clocks signals are derived. The clock signal VCO, synchronous with the coded serial stream, is used as the control (sampling) clock signal of a shift register to which the coded serial signal is fed. In the case already taken into consideration, the ratio between the equivalent number of bits of the coded serial stream and of the decoded serial stream is equal to 3:2(1.5). Therefore, the base clock signal VCO, derived from the transitions of the coded input signal, may be used for deriving a first fractionary frequency clock signal VCO/1.5, for sampling the decoded output signal, and a second fractionary frequency clock signal VCO/3, which is employed in the timing and synthesizing functions that must be necessarily performed by the decoding logic circuitry of the decoder.

Typically, a decoder of this type employs two decodification combinative logic networks. In the case of a decoder designed for handling an n number of bits, a first logic network processes the n-bits present at the n taps of a shift register to which the coded input signal is fed, under the control of the synchronous extracted clock signal VCO, and produces a first decoded signal. The signal produced by the first logic network is timed, by employing for the purpose a flip-flop that is sampled at the fractionary frequency of the first fractionary clock signal, in the example VCO/1.5. The so re-timed signal is fed to an input of a second combinative logic network. Said second combinative logic network processes a fractionary number of the n number of bits, picked up from the respective taps of the input shift register, the first decoded signal produced by the first combinative logic network and the second fractionary frequency clock signal (VCO/3 according to the example). This allows to re-synthesize the re-timed signal, produced by the first network and to produce a second decoded signal at the output of the second combinative logic network. Said second decoded signal is fed to a second output flip-flop sampled at the frequency of the first fractionary frequency clock signal, and produces a decoded NRZ output stream.

A decoder of this type together with an improved decoder are described in the co-pending patent application Ser. No. 08/285,918, which has been incorporated by reference. Said improved decoder incorporates timing, and multiplexing circuits for the first decoded signal. In cooperation with storing latches of the fractionary number of bits that are processed by the second logic network, said circuits permit to double the operating frequency of the decoder, for the same fabrication technology of the combinative logic networks.

Then, circuits "downstream" of the decoder must convert the serial stream of NRZ data in binary words, for example of 8 bits, that may thereafter be transferred toward a central processing unit, through parallel interfaces. This conversion of the data stream is commonly assisted by a microprocessor that supervises the serial-to-parallel conversion and the routing of the decoded bytes toward a support memory.

The solution of employing a decoder that instead of producing a single NRZ output stream, produces two output streams, that is a dual output stream, respectively a first NRZ0 data stream and a second NRZ1 data stream, is known. For the same frequency of the coded data signal present at the input of the decoder, the use of a dual-bit NRZ decoder permits to employ circuits for converting the decoded NRZ serial signal into a binary parallel signal capable of operating at half the frequency that would be necessary for handling a single-bit decoded NRZ output stream. Notwithstanding that the required duplication of the downstream conversion networks will not produce a substantial global energy saving, it is possible to employ "slower" integrated circuits for realizing the converting networks, that is devices fabricated with less sophisticated technologies and therefore less expensive. The saving increases with the frequency of the input serial data stream. In many cases, the possibility of employing devices that can be fabricated with different technologies, permits also to optimize performances of the respective subsystems.

In general, the choice of a single-bit NRZ decoder or of a dual-bit NRZ decoder, depends on design choices of the user of the integrated devices, that is of the manufacturer of the hardware apparatus. For need of utility, the operating mode of a decoder should be programmable by the user, according to his needs and/or in function of mutating operating conditions of the whole hardware system.

SUMMARY OF THE INVENTION

The decoder of the present invention is provided with circuitry for selecting either a single-bit output stream of decoded (NRZ) data or a dual-bit (NRZ0 & NRZ1) output stream of decoded data.

By the use of a pair of timing flip-flops, controlled by a fractionary frequency clock signal, a first decoded signal (NRZ0) generated by a first combinative logic network and a second decoded signal (NRZ1) generated by a second combinative logic network, are made available through respective outputs (terminals) of the decoder. A re-synthesizing of the first decoded signal produced by the first combinative logic network with the fractionary number of bits that are processed by the second combinative logic network is required. According to the present invention, such a re-synthesizing function is effected in the second combinative logic network, as in a normal single-bit prior art decoder, by employing said fractionary frequency clock signal. It "modifies" the combinative logic function of the network so that its output alternatively assumes a simply re-timed value, as substantially produced by the first combinative logic network, and the value that is produced by the second combinative logic network by processing the relative input bits. In practice, a multiplexing function is realized within the second combinative logic network, that is instrumental in making available, at the output of the decoder, alternatively the decoded dual-bits of the NRZ signal.

In summary, the circuit of the present invention employs a pair of output sampling flip-flops that are controlled by said fractionary frequency clock signal and a (2×1) multiplexer, provided with a selection input terminal. The decoder, through said output multiplexer, selectively provides either a single-bit decoded NRZ serial stream, sampled at the fractionary frequency of an output fractionary clock signal, or dual-bit decoded streams, NRZ0 and NRZ1, respectively, both sampled at the fractionary frequency of said fractionary clock signal, proportional to the frequency of said output fractionary clock signal.

BRIEF DESCRIPTION OF THE DRAWINGS

The different aspects and advantages of the invention will become more evident through the following description of some embodiments, herein incorporated by express reference and by referring to the attached drawings, wherein:

FIG. 4 is a timing diagram of the decoder of FIG. 3.

DESCRIPTION OF PREFERRED EMBODIMENTS

Figure 1:
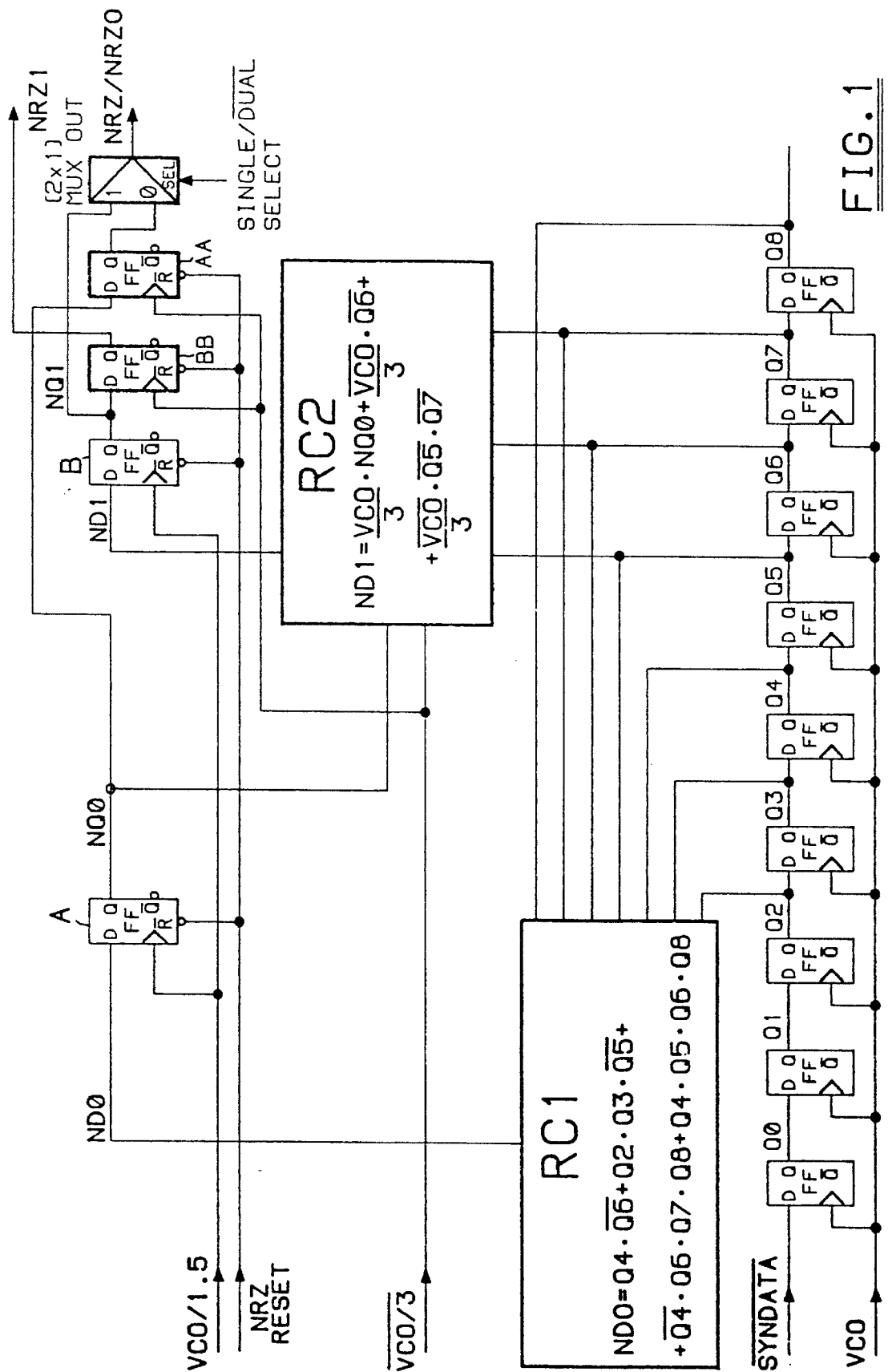
FIG. 1 is a block diagram of a decoder made according to the present invention.
Figure 3:
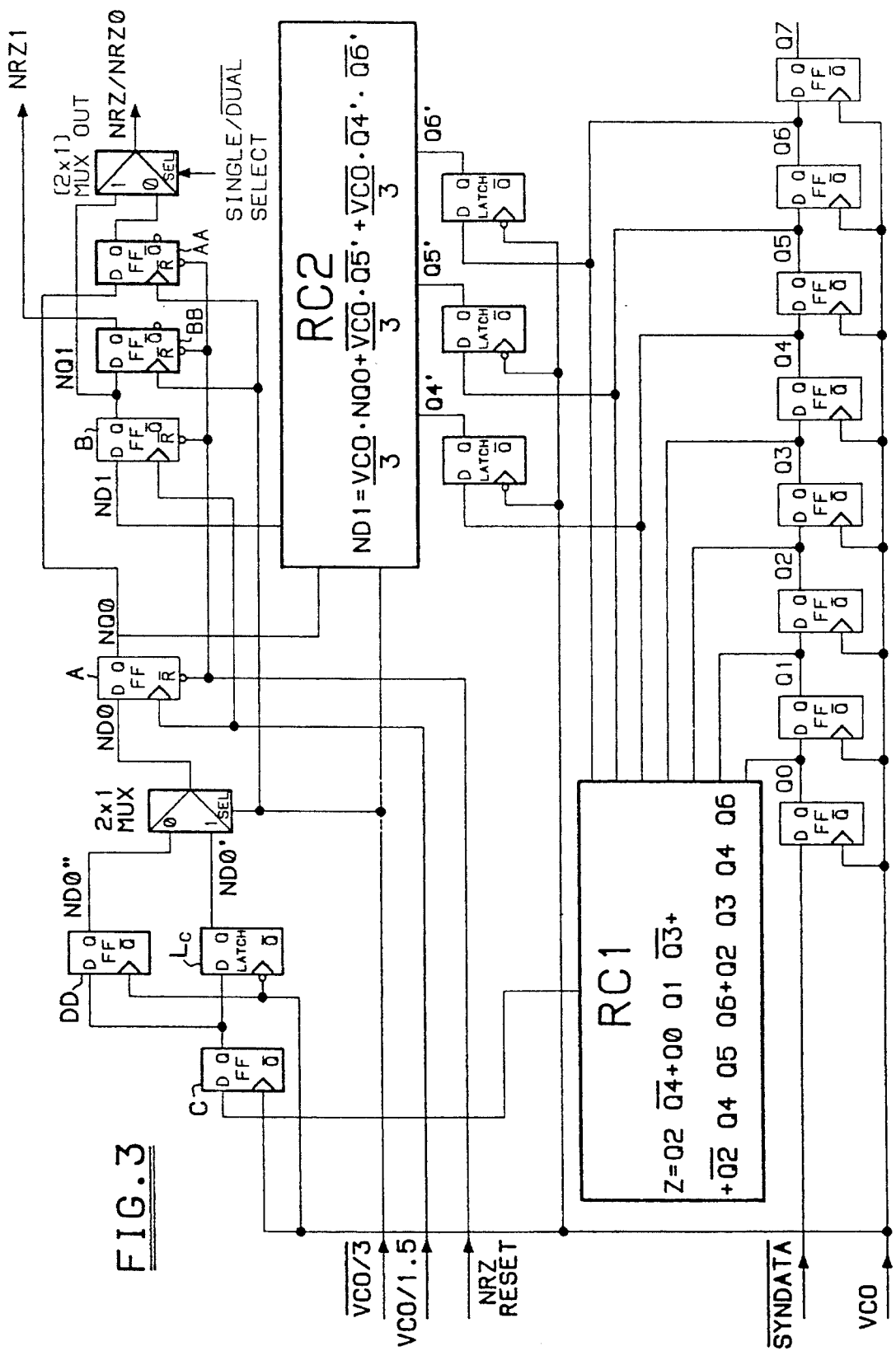
FIG. 3 is a block diagram of a decoder according to the invention having a "pipelined" structure capable of doubling the operating frequency for the same fabrication technology.

With reference to the FIGS. 1 and 3, a shift register SR that receives the serial stream of coded data, SYNDATA, is synchronized with an extracted, base clock signal VCO. It may be provided with a number of flip-flops (FFn) greater than the number of bits handled by the decoder, which for example, in the case shown, is of 7 bits. The flip-flops in excess, relative to the Q0 and Q1 taps of the shift register SR, may be employed for other accessory functions, as is well known to a person skilled in the art.

A first combinative logic block RC1 processes the Q outputs of the seven flip-flops Q<2:8>, that is the taps relative to the seven bits handled by the decoder, and produces a first value ND0. The latter is fed to a first timing flip-flop A, sampled at a first fractionary clock frequency VCO/1.5.

In prior art dual-bit circuits not shown, a second combinative logic network processes the bits Q5, Q6, Q7 and produces a second value which is fed to a second timing flip-flop, which is also sampled, as the first flip-flop A, at the first fractionary clock frequency VCO/1.5. Differently from single-bit NRZ decoders and from the embodiments of the present invention, shown in FIGS. 1 and 3, the ND0 value, re-timed by the flip-flop A, i.e. the value NQ0, is not input to the second logic network together with a second fractionary clock signal VCO/3 to produce a re-synthesized signal.

Instead, the output stream NQ0 of the flip-flop A is fed, to the input of a third flip-flop, which is sampled at the frequency of the second fractionary clock signal VCO/3, to produce a first, decoded, dual-bit serial signal NRZ0, at an output of the decoder. Similarly, the output signal of the second flip-flop is fed to an input of a fourth flip-flop, which is also sampled at the frequency of said second fractionary clock signal VCO/3, to produce a second, decoded, dual-bit serial signal NRZ1, at a respective output of the decoder.

In the embodiments of the invention depicted in FIGS. 1 and 3, two additional flip-flops AA and BB that implement the mode, whereby a pair of decoded dual-bit output signals, sampled at the frequency of the second fractionary clock signal VCO/3, are produced, are put in evidence in the block diagram, by using heavier lines in tracing them.

According to the embodiment of the invention depicted in FIG. 1, the output signal NQ0 of the first timing flip-flop A, as well as the second fractionary clock signal VCO/3 are input to the second logic network RC2 in order to generate at the output thereof a re-synthesized signal ND1, as normally effected, also in single-bit NRZ decoders of the prior art. Simultaneously, the first re-timed signal NQ0 is fed to an input of the third flip-flop AA, sampled, at the fractionary frequency clock signal VCO/3, and the output of which is connected also to a first input (0) of a (2×1) output multiplexer MUX OUT. The second re-timed output signal of the flip-flop B is fed at the other input (1) of the MUX OUT multiplexer, as well as to the input of the fourth flip-flop BB, which is also sampled as the flip-flop AA at the second fractionary frequency clock signal VCO/3. The output stream of the flip-flop BB represents one (NRZ1) of the dual-bit decoded signals, the other one of which is selectably provided at the respective output of the decoder, through the output multiplexer MUX OUT, by selecting its 0 input. Viceversa, by effecting a different selection between the two inputs of the output multiplexer, i.e. by selecting the 1 input thereof, a single-bit decoded NRZ stream is made available at the output of the decoder.

The selection of one or the other of the two possible output modes of the decoder is effected through a control input terminal (SEL) of the output multiplexer MUX OUT. The elements that implement the selection of the two different output modes of the decoder are made evident in FIG. 1 by the portions traced with heavy lines.

Figure 2:
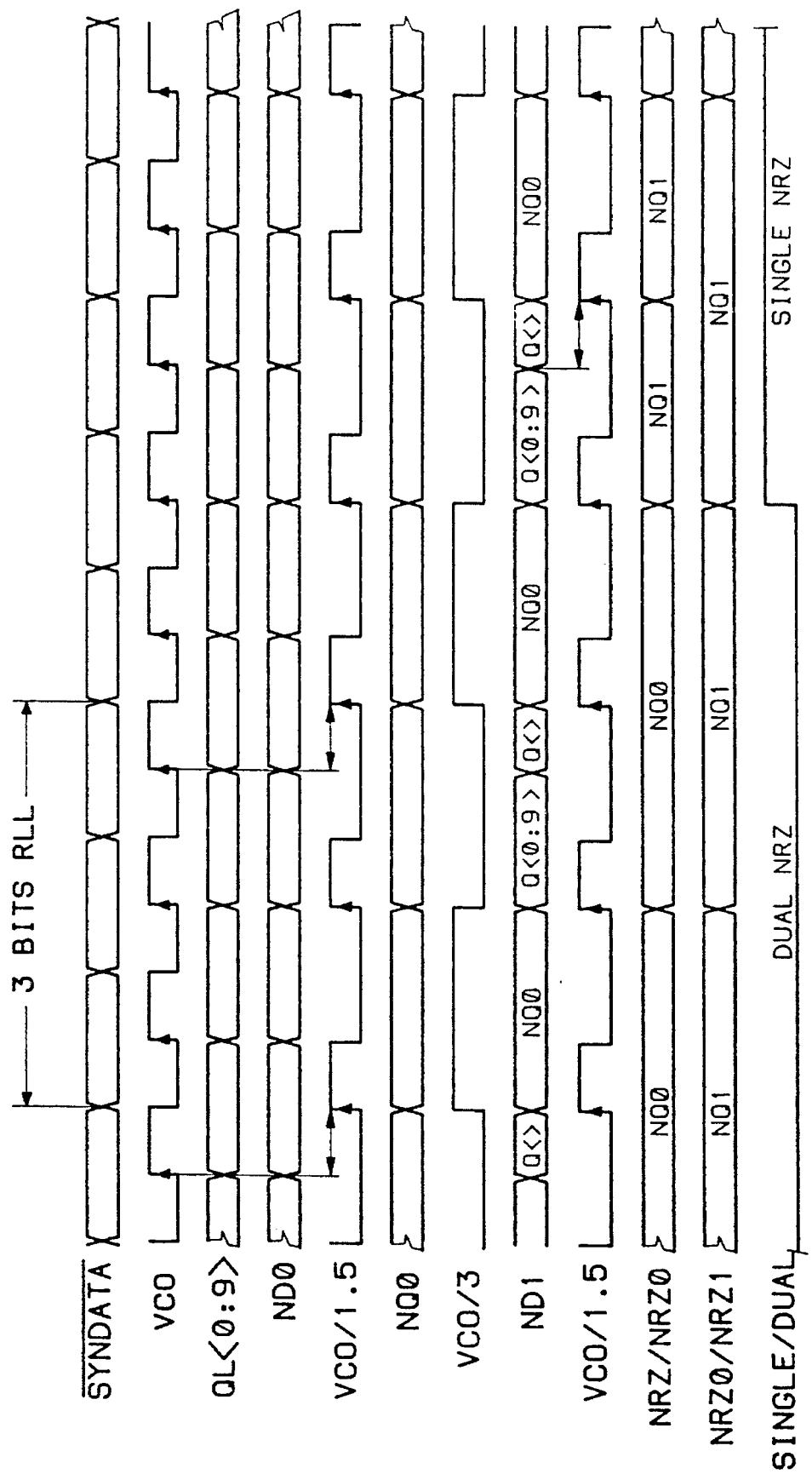
FIG. 2 is a timing diagram relative to the decoder of FIG. 1.

FIG. 2 shows the timing diagrams of the decoder of FIG. 1. It evidences the differences between a single-bit decoded output serial signal (single-bit stream) NRZ and a dual-bit decoded output signal (dual-bit stream) that is constituted by the pair of serial signals NRZ0 and NRZ1, that may be selectably output through the SEL command of the output multiplexer.

An embodiment similar to the one depicted in FIG. 1, but employing a different architecture of the decoder, is shown in FIG. 3. The architecture of the decoder of FIG. 3 is substantially the architecture described in the co-pending patent application Ser. No. 08/285,918, which has been incorporated by reference. Also in this case, the elements that characterize the device object of the present invention are put in evidence in the block diagram by tracing them with thick lines.

In both embodiments of the decoder of the invention the end user is capable of implementing a selection between a single-bit NRZ output stream or a dual NRZ0 & NRZ1 output stream by applying an appropriate command (address signal) through a dedicated pin of the device or in any other appropriate manner.

The decoder made according to the present invention permits a complete adaptability of the device to the different situation of use, thus providing the user with the possibility of selecting one or the other output mode for the decoded stream, depending on the design choices of the hardware system, on the operating frequency and/or on particular operating conditions, for example heat dissipation capabilities.

What is claimed is:

1. A decoder of a coded serial stream of digital data, comprising:

a first circuit block for generating a base clock signal, synchronous with the transitions of the coded serial stream;

a second circuit block for deriving from said base clock signal a first fractionary frequency clock signal, having a frequency fractionary with respect to the frequency of said base clock signal and with a frequency ratio congruent with the ratio between the number of bits of the coded serial stream and the number of equivalent bits of a decoded stream, and a second fractionary frequency clock signal, having a fractionary frequency with respect to said first fractionary frequency clock signal;

a shift register including a plurality of flip-flops, receiving the coded serial stream, under control of said base clock signal;

a first combinative-logic decoding network for processing n bits stored in said shift register and producing a first pre-decoded value;

a first synchronizing flip-flop, sampled by said first fractionary frequency clock signal, and receiving said first pre-decoded value;

a second combinative-logic decoding network for combining a fractionary number of said n bits, said first synchronized pre-decoded value and said second fractionary frequency clock signal, and for producing a second pre-decoded value at an output thereof;

a second output flip-flop, sampled by said first fractionary frequency clock signal, and receiving said second pre-decoded value;

third and fourth output flip-flops, controlled by said second fractionary frequency clock signal, receiving the output stream of said first flip-flop and the output stream of said second flip-flop, respectively, and producing two respective output streams; and an output multiplexer, having a first input receiving the output stream of said third flip-flop, and a second input receiving the output stream of said second flip-flop;

wherein through a selection terminal of said output multiplexer either a serial stream of decoded data or a first serial stream of a dual-bit decoded data stream are selectable, and a second serial stream of said dual-bit decoded data stream is available through an output of said fourth flip-flop.

2. A decoder according to claim 1, capable of handling an input coded serial stream of an RLL (1,7) type.

3. A decoder for selectively providing one or two output bits of data extracted from a coded serial data stream, comprising:

a shift register for receiving the coded serial data stream, and having a plurality of outputs therefrom;

a first clock signal synchronous with data transitions in the coded serial data stream;

a second clock signal having a frequency less than the first clock signal by a fraction proportional to a ratio between a number of bits in the coded serial data stream and a corresponding number of bits in the data;

a third clock signal having a frequency less than the second clock signal by a fraction proportional to a preselected ratio;

a first combinational logic circuit connected to the shift register outputs, such first circuit generating a first pre-decoded value;

a second combinational logic circuit connected to receive a subset of the shift register outputs, said third clock signal and said first pre-decoded value, such second circuit generating a second pre-decoded value;

a first flip-flop connected to the output of the first combinational logic circuit, and clocked by the second clock signal, wherein the output thereof is connected to an input of the second combinational logic circuit;

a second flip-flop connected to the output of the second combinational logic circuit and clocked by the second clock signal;

a third flip-flop connected to the output of the second flip-flop and clocked by the third clock signal;

a fourth flip-flop connected to the output of the first flip-flop, and clocked by the third clock signal; and a multiplexor connected to the outputs of the second and fourth flip-flops, and having a control input for selecting a single bit output mode or a two bit output mode;

wherein the outputs of the third and fourth flip-flops provide, in parallel, the two bit outputs of the decoder in the two bit output mode, and wherein the output of the second flip-flop provides the output of the decoder in the single bit output mode.

4. The decoder of claim 3, further comprising:

a first clocked delay circuit between the output of the first combinational logic circuit and the input of the first flip-flop to delay the output of the first combinational logic circuit by two cycles of the first clock signal; and a second clocked delay circuit between the subset of the shift register outputs and the corresponding inputs of the second combinational logic circuit to delay the subset of shift register outputs for one cycle of the first clock signal before providing them to the second combinational logic circuit.

5. The decoder of claim 4, wherein the second clocked delay circuit comprises:

a plurality of latches between the subset of shift register outputs and the inputs of the second combinational logic circuit, each clocked by the first clock signal.

6. The decoder of claim 4, wherein the first clocked delay circuit comprises:

a fifth flip-flop connected to the output of the first combinational logic circuit, and clocked by the first clock signal;

a sixth flip-flop connected to the output of the fifth flip-flop, and clocked by the first clock signal;

a latch connected to the output of the fifth flip-flop, and clocked by the first clock signal; and a delay multiplexor connected to the outputs of the sixth flip-flop and the latch, and having a control input connected to the third clock signal.

* * * * *